United States Patent [19]

Scifres et al.

[11] 4,358,851
[45] Nov. 9, 1982

[54] FIBER OPTIC LASER DEVICE AND LIGHT EMITTER UTILIZING THE DEVICE

[75] Inventors: Donald R. Scifres; Robert D. Burnham, both of Los Altos; William Streifer, Palo Alto, all of Calif.

[73] Assignee: Xerox Corporation, Stamford, Conn.

[21] Appl. No.: 125,415

[22] Filed: Feb. 28, 1980

[51] Int. Cl.³ .............................................. H01S 3/082
[52] U.S. Cl. .................................... 372/97; 350/96.15;
350/96.18; 350/166; 372/6
[58] Field of Search ............... 350/96.15, 96.16, 96.17,
350/96.18, 96.29, 164, 166, 413, 416, 439, 165;
356/352; 331/94.5 C; 357/18; 372/6, 7, 97, 102

[56] References Cited

U.S. PATENT DOCUMENTS

| | | | |
|---|---|---|---|
| 3,556,640 | 1/1971 | Austin | 350/164 |
| 3,803,511 | 4/1974 | Thompson | 331/94.5 |
| 3,877,052 | 4/1975 | Dixon et al. | 350/96.15 |
| 4,079,404 | 3/1978 | Comerford | 357/18 |
| 4,088,389 | 5/1978 | Zucker et al. | 350/96.17 |
| 4,092,659 | 5/1978 | Ettenberg | 357/18 |
| 4,143,940 | 3/1979 | Khoe | 350/96.15 |
| 4,152,674 | 5/1979 | Taguchi | 356/352 |
| 4,156,206 | 5/1979 | Comerford et al. | 350/96.18 |
| 4,257,671 | 3/1981 | Barbaudy et al. | 350/96.15 |
| 4,286,232 | 8/1981 | Puech et al. | 350/96.15 X |
| 4,328,468 | 5/1982 | Krawczak et al. | 372/97 |

FOREIGN PATENT DOCUMENTS

53-21354  9/1979  Japan .

*Primary Examiner*—John D. Lee
*Attorney, Agent, or Firm*—W. Douglas Carothers, Jr.

[57] ABSTRACT

A fiber optic device basically comprising an optical fiber/interference filter combination finds useful application in optical communication systems for wavelength selection or bandwidth selection from a multiwavelength light source or emitter. If the emitter is a semiconductor laser, the device may be also employed to provide single longitudinal mode control at the selected wavelength or bandpass.

10 Claims, 15 Drawing Figures

FIBER OPTIC LASER DEVICE AND LIGHT EMITTER UTILIZING THE DEVICE

BACKGROUND OF THE INVENTION

This invention relates to fiber optic devices for employment in optical communication systems where it is desired to have a multiplexed wavelength transmission capabilities with independent light sources, which, in conjunction with the fiber optic devices transmit light at a given wavelength and with independent detection components designed to detect light at a given wavelength.

Multilayer reflectors and narrow band interference filters are well known in the art of optics for reflecting or passing light of a given wavelength or bandwidth. Such filters are designed for optical communication systems for passing selective wavelengths while rejecting other wavelengths. Examples of such reflectors and filters are disclosed in U.S. Pat. Nos. 3,037,362; 3,556,640; 4,092,659 and 4,099,840.

Employment of such filters in optical communication systems has not met with great success. The basis for this invention is the practical and simple inclusion of fiber optic devices having narrow passband capabilities or rejected and reflected wavelength capabilities readily adaptable in optical communication systems employing, for example, semiconductor lasers, diode detectors, optical mixers and fiber optics.

SUMMARY OF THE INVENTION

In accordance with the present invention, a fiber optic devices for use in an optical communication system is characterized by an interference filter having a narrow bandpass or capable of passing one or more selected wavelengths. The filter may be a bandpass filter or bandpass reflector. The device comprises a multilayered structure deposited on the cross-sectional end of a length of optical fiber. The filter may be designed to pass a selected wavelength from a source of light coupled to the optical fiber and reflect all other wavelengths back to the source. The filter may be designed to reflect all wavelengths from the source and act as a partial reflector/filter for a given wavelength permitting part of that wavelength to be reflected and the other part to pass into the optical communication system.

An important application for partial wavelength reflection and passage of a particular wavelength is in connection with a light emitter such as, a semiconductor laser, e.g. a Ga As/Ga AlAs injection laser. The bandwidth of the interference filter may be designed to be within the operating wavelengths of the laser to permit passage of at least a selected wavelength within the band of optical emission from the laser while reflecting the remaining wavelengths to provide optical feedback for the laser. The filtering capabilities of the filter can be designed either to pass a given wavelength from the semiconductor laser or a narrow bandpass of laser emitted wavelengths.

Other objects and attainments together with a fuller understanding of the invention will become apparent and appreciated by referring to the following description and claims taken in conjunction with the accompanying drawings.

BRIEF DESCRIPTION OF THE DRAWINGS

FIGS. 7 through 14 disclose various alternative light source forms that may be utilized in the optical communication system of FIG. 6 and in particular, FIG. 7 discloses a semiconductor laser optically coupled to a combination collimated lens and interference filter deposited on the end of an optical fiber;

FIG. 8 dicloses a semiconductor laser optically coupled to an interference filter deposited on the end of an optical fiber;

DESCRIPTION OF THE PREFERRED EMBODIMENTS

In FIGS. 1 through 5, various arrangements are shown for employment of a fiber optic device 10 which comprises an optical fiber 12 having an end portion upon which is deposited a multilayer interference filter, $F_j$, shown at 14. The filter 14 comprises a plurality of contiguous layers of alternating composition. Each of the layers may be approximately $\lambda/4n$ in thickness, $\lambda$ being a free space wavelength of radiation emitted from the light source 16 and $\lambda n$ is the index of refraction of the particular contiguous layers deposited. Such filters are designed not to transmit all wavelengths of emitted light except to be at least partially transparent to light at a selective wavelength, $\lambda_j$. The filter 14 may also be designed to be almost totally or partially transparent to the wavelength, $\lambda_j$. The filter 14 also may be a bandpass filter or a bandpass reflector. In all cases including those which follow the interaction of the fiber/filter laser combination must be such that the laser experiences maxima of net gain at the desired outputs wavelengths. Thus, the filter may have to produce simultaneously low reflectivity and low transmissivity by virtue of selective absorption.

The filter may be comprised of alternating dielectric materials, such as, $Al_2O_3$, $M_gF_2$, $SiO_2$, Si, and other dielectrics and polarizable and photosensitive materials. The filter may also be comprised of alternating dielectric, absorbing and/or metallic materials, such as, the above-mentioned materials and very thin layers of tellurium, silver, gold, aluminum and bismuth for example.

The fiber optic device 10 provides a unitary structure for the passage of single wavelength, $\lambda_j$, or a narrow bandpass. Most importantly, the filter/optical fiber combination provides better wavelength selectivity and sharp bandpass integrity.

If the light source 16 is a semiconductor laser and a high level of reflectivity is desired, the filter 14 may be directly deposited on the cleaved output facet of the laser. The light from the laser will not have a sufficient time to diverge upon exit from the laser, optimizing the reflectivity upon interaction with the filter 14. The same effect may also be achieved by using a microlens 18 shown in FIG. 1a positioned between the end of the optical fiber 12 and the interference filter 14. The microlens 18 with its parabolic distribution of refractive index will act as a lens and is employed to expand the light into a parallel collimated beam for presentation to and interaction with the interference filter 14.

Figure 1:
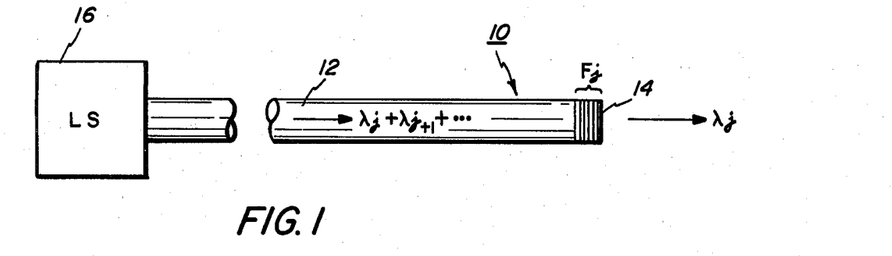
FIG. 1 discloses a fiber optic device comprising an optical fiber with an interference filter deposited on an end portion of the fiber.
Figure 1A:
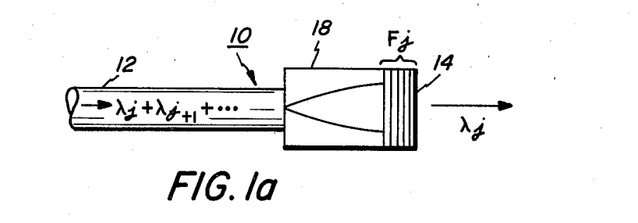
FIG. 1a is similar to FIG. 1 but, in addition includes a collimating lens between the fiber end and the filter.

The center of the lens 18 should be precisely positioned relative to the axial center of the fiber. This is conveniently accomplished by determining the point of maximum transmission through the fiber and lens and then using epoxy to secure the lens 18 to the end of the fiber 12 while maintaining optical alignment of these components. Also, an adjustable mechanical clamp assembly may be employed instead of an epoxy connection. Such mechanical couplers capable of fine adjustment for optical alignment are known in the art.

Figure 2:
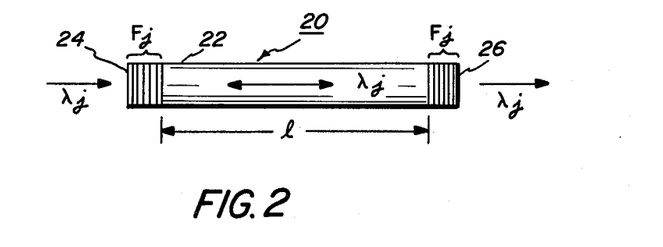
FIG. 2 discloses interference filters deposited on opposite ends of an optical fiber forming Fabry-Perot cavity.

FIG. 2 discloses a fiber optic device 20 comprising a length, 1, of optical fiber 22, with interference filters 24 and 26 deposited on the opposite ends of the fiber. This arrangement may be designed with filters that act as nearly perfect reflectors for a broad range of wavelengths of radiation. Such a structure 20 can function as a Fabry-Perot interferometer if a single mode fiber is used. Such an interferometer may be scanned in optical length path by a variety of techniques including bending of the fiber, heating of the fiber, or placing the fiber in an acoustic, or electric or magnetic field. Such scanning can modulate the coherent light signal propagating through the filter as in a Fabry-Perot interferometer. In addition, if a multimode fiber is used, two or more input wavelengths, $\lambda_1, \lambda_2, \ldots \lambda_i$ can be spatially separated by the Fabry-Perot interferometer owing to the different opcial path lengths. A narrow band reflector/filter for selected wavelengths of radiation, may also be designed in this configuration. In this case, two dielectric filters are spaced by a small distance (20–50 mm) to provide a narrow passband or reflector.

Figure 3:
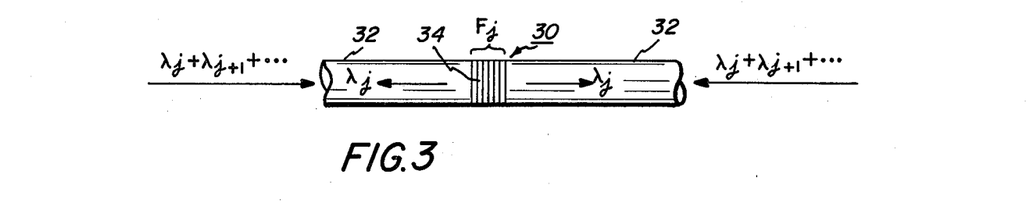
FIG. 3 discloses a filter positioned in the length of an optical fiber as part of a communication link.

FIG. 3 discloses a fiber optic device 30, with an interference filter 34 positioned within an optical fiber 32. Filter 34 acts to pass wavelength, $\lambda_j$, from either direction in the optical fiber 32.

Figure 4:
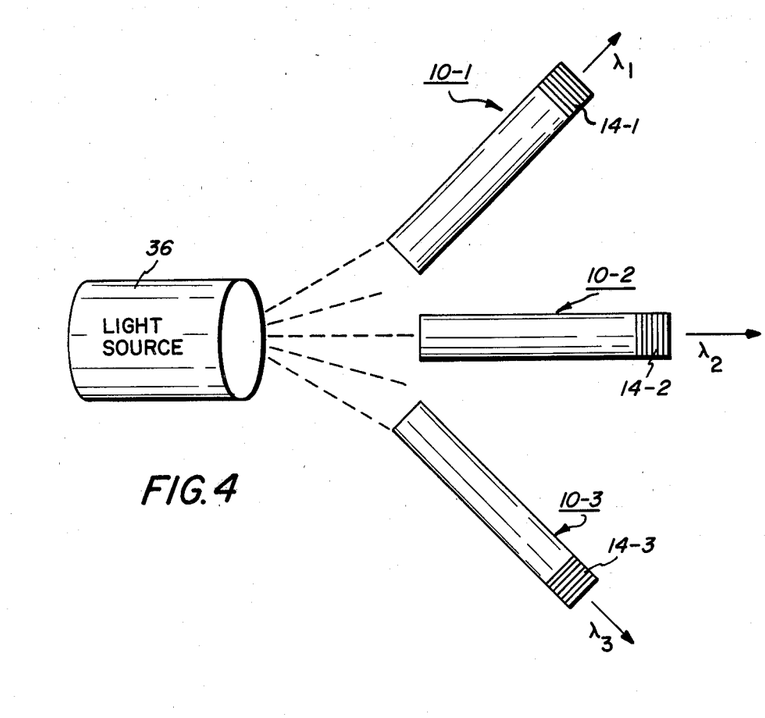
FIG. 4 discloses a multi wavelength light source with a plurality of fiber optic devices for passing a selected wavelength emitted from the source.

The type of radiation to be employed with the fiber optic devices 10, 20 and 30 is not limited. As illustrated in FIG. 4, the light source 36 may provide coherent or noncoherent radiation with the fiber optic devices 10-1, 10-2 and 10-3, respectively, having interference filters 14-1, 14-2 and 14-3 capable of filtering wavelengths $\lambda_1$, $\lambda_2$ and $\lambda_3$. Such wavelengths may be designed to be different color wavelengths from the optical spectrum.

Figure 5:
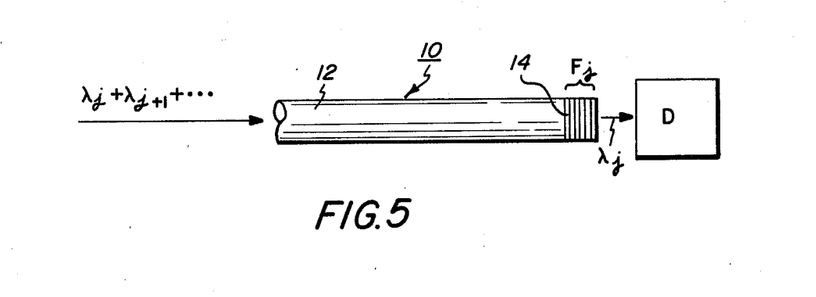
FIG. 5 discloses the fiber optic device of FIG. 1 used for detection of a selected wavelength from a multi wavelength source.

FIG. 5 illustrates the fiber optic device 10 employed in combination with a single detector 38, such as, a photodiode, to detect wavelength, $\lambda_j$ from the device 10.

FIGS. 1–5 illustrate the range of possibilities of fiber optic devices 10, 20 and 30. In each case an interference filter is deposited on one end of a section of an optical fiber.

Filter deposition on the ends of the fibers is accomplished best by deposition in a vacuum system, the geometry of the layers and their materials being chosen to provide the selected wavelength, $\lambda_j$, or the selected bandpass. First, a bundle of optical fibers, such as 10,000 fibers, with exposed ends are maintained in fixed relation by means of dipping the fiber ends in a potting material. There are suitable epoxy materials for this purpose. This secures the fibers firmly together for subsequent processing. The fiber bundle may alternatively be mechanically clamped together but this is not preferred because of the tendency of the fiber ends to move around during subsequent processing.

Next, the fiber ends are polished in a polishing jig.

After polishing, the potting material is removed from the vicinity of the fiber ends so that the material does not interfere with the deposition process. An organic solvent is used that dissolves the epoxy potting material but does not damage the optical fibers, such as, quartz optical fibers.

The optical fiber bundle is then placed in a vacuum chamber with the fiber ends exposed to the vapor of various sources of materials to be deposited and form the filter layers. The deposition process is controlled to deposit the materials to the desired thickness on all of the fiber ends. The sources of materials in the chamber for layers not then being deposited are masked during deposition of other composite layers.

After the deposition of the multilayers, the fiber bundle is removed from the chamber and the individual fibers may be easily pulled apart and separated from one another due to the limited amount of remaining potting material.

Figure 6:
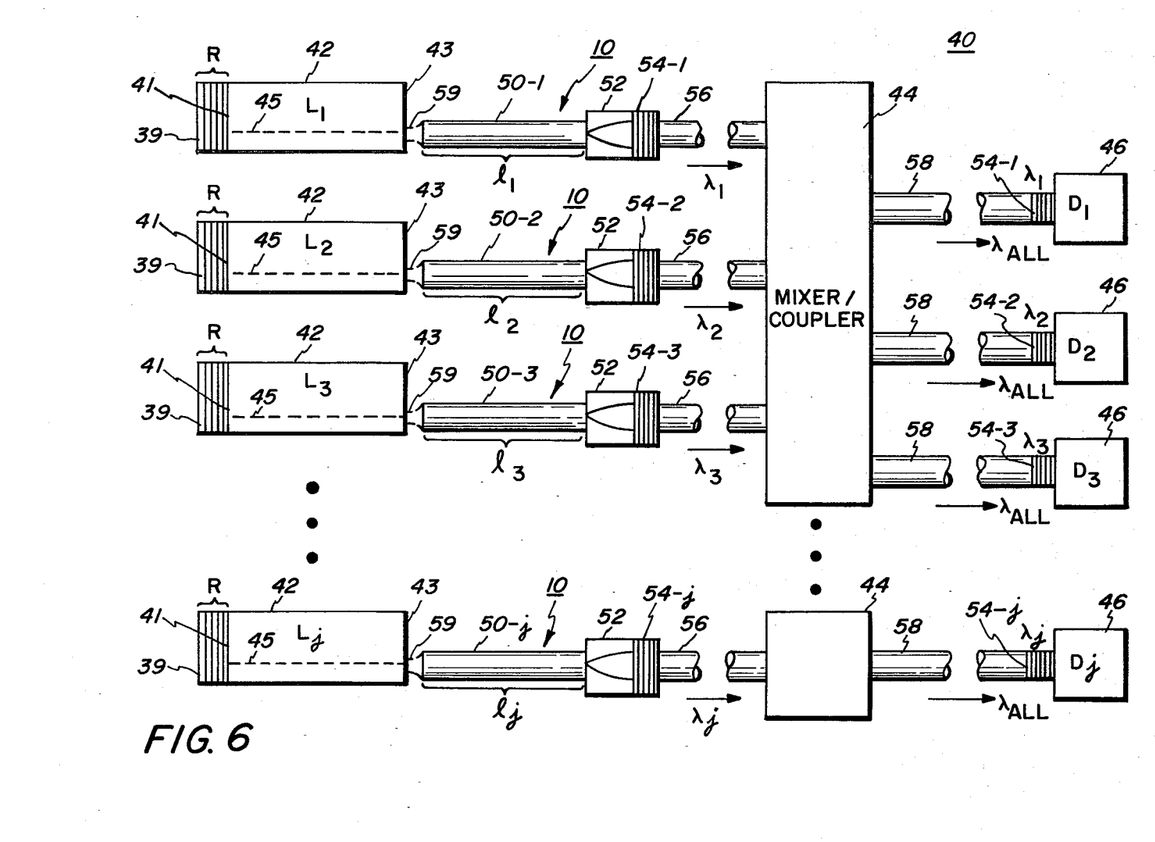
FIG. 6 discloses a multi wavelength communication system employing the fiber optic devices of FIGS. 1 through 5 and semiconductor lasers as light sources.

The fiber optic devices 10, 20 or 30 may be employed in an optical communication system illustrated at 40 in FIG. 6.

In FIG. 6, the optical communication system 40 generally comprises light emitters in the form of semiconductor lasers 42, an optical mixer/coupler 44, which may comprise, for example, a solid mixer rod, star coupler, or other low loss optical fiber transmission mixer, and optical detectors 46, such as, photodiodes. The lasers 42 have reflectors, R, deposited on their rear facets 41. Reflectors 39 are fabricated to provide reflection of the spontaneous emission from the laser. The dotted line 45 represents the active layer and optical cavity of the laser and the line of light propagation between the mirror facets 41 and 43 of the laser structure.

The facet 43 has an antireflection coating applied to its surface to prevent facet damage due to exposure to the ambient. This coating also increased threshold for catastrophic mirror damage. The coating further increases the efficiency of extracting useful optical power from the facet 43.

The fiber optic device 10 is coupled to a respective laser 42 by means of epoxy 59 or other suitable optical coupling known in the art. A chemically etched well (not shown) may be formed in the end of the optical fiber 50 which is parabolic in shape. The epoxy coupling 59 will fill the formed well upon alignment with the cavity 45 of the laser 42. This provides a convex lens arrangement formed by the epoxy itself with the fiber well for more efficient coupling of the laser light into the fiber 50. In such an arrangement, the fiber 50 has a lower index of refraction than the epoxy coupling material.

The end of the fiber 50 may be provided with a spherical lobe larger in extent than the diameter of the fiber. The lobe is epoxy coupled to the laser or light emitter and forms a converging lens for emitted light. In such an arrangement, the fiber 50 has a higher index of refraction than that of the lobe.

Each fiber optic device 10 in FIG. 6 comprises an optical fiber section 50 of specific length, a microlens 52 and an interference filter 54. The optical fiber has a specific length, 1, to provide a Fabry-Perot cavity between the mirror facet 43 of the laser 42 and the interference filter 54. This cavity comprises two reflectors separated by a distance, 1, the laser facet 43 representing one reflector and the interference filter 54 representing the other reflector. Facet 43 reflects a portion of the spontaneous emission from the laser 42 for laser feedback while the filter 54 has maximum reflectivity of spontaneous emission from the laser 42 back into the filter cavity 50 of the selected wavelength, $\lambda_1, \lambda_2, \lambda_3, \ldots$ or a selected narrow bandpass. Wavelength $\lambda_j$ represents a primary wavelength in the spontaneous emission from each of the lasers 42. Simultaneously each filter also transmits some portion of this wavelength.

The advantage of employing the device 10 with the laser 42 is that a very sharp selected wavelength filter can be fabricated to provide a second Fabry-Perot resonator that will impose longitudinal mode restrictions on the laser 42 and simultaneously pass a desired wavelength into an optical communication link. The desired wavelength may be data modulated via pulse operation of laser 42. Laser mode control is important in optical communication systems. Longitudinal mode control means frequency stabilization and efficient operation at the selected wavelength employed in the system.

The material output of devices 10 of system 40 are coupled by optical fibers 56 to mixer/coupler 40 where the wavelengths of light are commingled for transfer to various destinations in the system or for optical coupling into other systems. Destinations are represented by the optical fibers 58 coupling the optical output of the mixer/coupler 40 to detectors 46. Although all commingled wavelengths of light appear on each of the fibers 58, filters 54 pass only the designed wavelength or bandpass for detection by the detector 46. In the representation of FIG. 6, filters 51-1 are designed to pass wavelength $\lambda_1$; filters 54-2, wavelength $\lambda_2$; filters 54-3, wavelength $\lambda_3$, etc. Also optical fibers 50 are designated 50-1; 50-2, 50-3, . . . 50-j to indicate that their lengths, 1, will vary depending on the wavelengths from the laser 42 selected for transmission. In general, the fibers may be approximately 50μ or greater in length.

Detectors 46 may be secured by epoxy to filters 54 or may be aligned in fixed, spaced relation relative to its respective filter.

Alternative laser source arrangements for use in system 40 are disclosed in FIG. 7-14.

Figure 7:
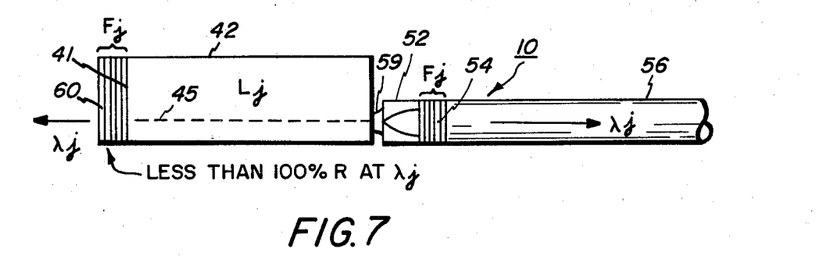

In FIG. 7, laser 42 is coupled at 59 directly to the combination microlens 52 and filter 54. The light emitting region at facet 43 is centered on the optical axis of the microlens 52. Filter 60 is a partial reflector at wavelength $\lambda_j$ so that the selected wavelength emission can also be detected from facet 41.

Figure 8:
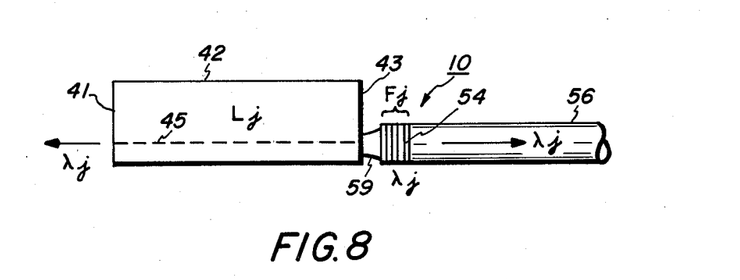

The configuration of FIG. 8 is the same as FIG. 7 except that the filter 60 is not present. Thus, a portion of all spontaneous emission from the laser 42 is present at the rear facet 41. Also, the microlens 52 is not utilized in the fiber optic device 10. This represents one of the simplest forms for the fiber optic device 10.

Figure 9:
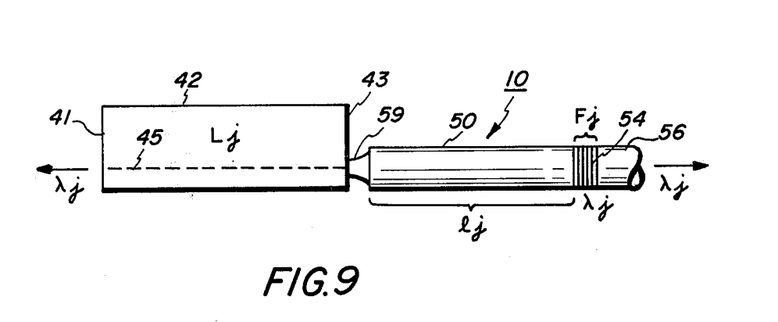
FIG. 9 discloses a semiconductor laser optically coupled at one end to a length, 1, of an optical fiber with an interference filter deposited on the other end of the fiber.

In FIG. 9, the configuration shown is the same as those shown in FIG. 6 except that the reflector 39 is not present, permitting all spontaneous emission to be detectable from facet 41. Also, the microlens 52 is not employed. The length, 1, of the optical fiber 50 may be selected to provide a mode locked wavelength, $\lambda_j$.

Figure 10:
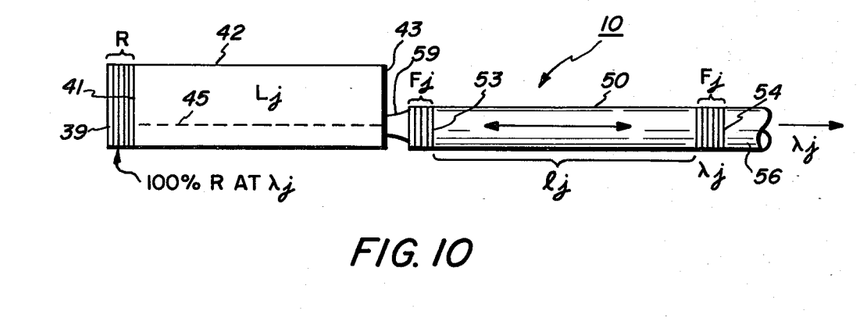
FIG. 10 discloses a semiconductor laser optically coupled to a fiber optic device comprising a length, 1, of optical fiber with different interference filters deposited on opposite ends of the fiber.

In FIG. 10 the combination laser/fiber optic device 10 is the same as those shown in FIG. 6 except that an additional filter 53 is deposited on the other end of the optical fiber section 50. Filter 53 is designed to pass a portion of $\lambda_j$ while relecting the remaining portion morestrongly than other emitted wavelengths of radiation for optical feedback. Filter 54 may be designed to pass almost 100% of $\lambda_j$ or may be designed to pass less than 100% of $\lambda_j$ to render fiber optic device 10 a Fabry-Perot cavity for fine tuning of the longitudinal mode operation of laser 42 at $\lambda_j$.

Figure 11:
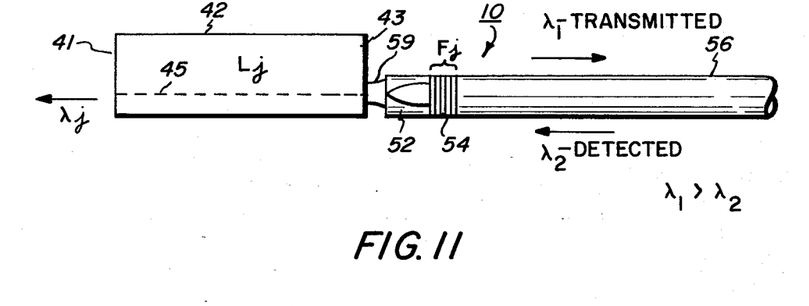
FIG. 11 is a similar to the device shown in FIG. 7 except the device here is designed to transmit at one wavelength and detect a different wavelength.

The structure shown in FIG. 11 is the same as that of FIG. 7 except that the rear facet 41 of laser 42 does not include the partial filter 60 and, further, the filter 54 is designed to have a filter response for $\lambda_1$, the major wavelength of spontaneous emission from laser 42, where $\lambda_1$ is greater than $\lambda_2$. Laser 42 may be reverse biased to act as a detector for $\lambda_2$ eminating from another light source in an optical communication system connected to optical fiber 56. For this purpose, an antireflection coating may be provided on the surface of laser facet 43 so that $\lambda_2$ will readily couple into the laser optical cavity 45. Laser 42, operating as a detector, can absorb wavelength $\lambda_2$ since it has a shorter wavelength than its major wavelength $\lambda_1$. Filter 54 may be designed, for example, to be reflective for 50% to 70% of $\lambda_1$ but have no reflective response for $\lambda_2$. A sensing circuit (not shown) sensitive to $\lambda_2$ may be its detectable optical input, such as a photodiode, positioned at filter 54 and operative to reverse the bias on laser 42 when $\lambda_2$ is detected in optical fiber 56. With the bias reversed, laser 42 will respond similar to a photodiode.

Figure 12:
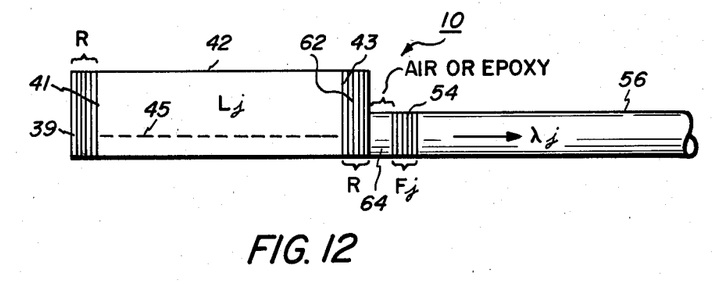
FIG. 12 discloses a semiconductor laser optically coupled to a spaced reflector/filter arrangement providing a sharp, narrow bandwidth filter.

The configuration of FIG. 12 permits the developement of narrow and sharp bandpass filtering. A partial reflector 62 is positioned at the emitting region of laser facet 43. Filter 54 is deposited on the end of fiber 56 having a filter pass for $\lambda_j$. The device 10 is coupled to the partial reflector 62 in space relation, indicated at 64, which may be accomplished by a mechanical coupler or by epoxy. As an example, the spacing 64 may be about 10μ to 50μ. The reflector 62 may transmit, for example, 50% to 70% of the spontaneous emission of the laser 42, the remaining portion of which is reflected back as optical feedback for the laser. The facet 43 may be provided with an antireflection coating to increase coupling efficiency.

The arrangement in FIG. 12 provides for a very narrow bandpass, such as 10A to 20A wide. The spaced reflector 62 and filter 54 act as spaced reflectors for a portion of the laser spontaneous emission forming a secondary optical cavity generally represented by the spacing 64. This provides single longitudinal mode operation for the laser 42. The laser 43 operates with a certain set of lasing frequencies within a given bandwidth. The Fabry-Perot cavity 64, being in addition to the laser cavity 45, imposes new restrictions on this set of frequencies in a manner that certain lasing wavelengths interfere constructively to produce major high intensity wavelengths. Filter 54 is designed to pass the major wavelength, $\lambda_j$.

Figure 13:
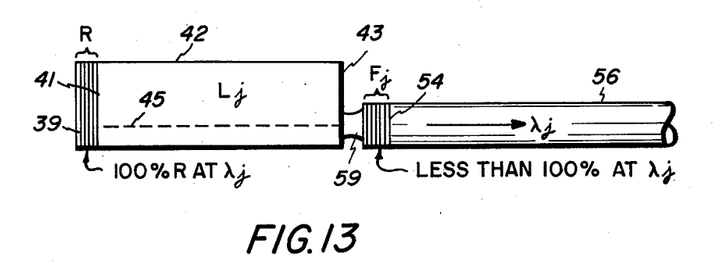
FIG. 13 is similar to the device disclosed in FIG. 8 with the exception that the selected wavelength is also the major wavelength component in optical feedback for operation of the laser.

In FIG. 13, the configuration is the same as that in FIG. 8 except reflector 39 is deposited on facet 41 of laser 42. Reflector 39 is designed to provide almost 100% reflection at facet 41 for the $\lambda_j$ emission from laser 42.

Figure 14:
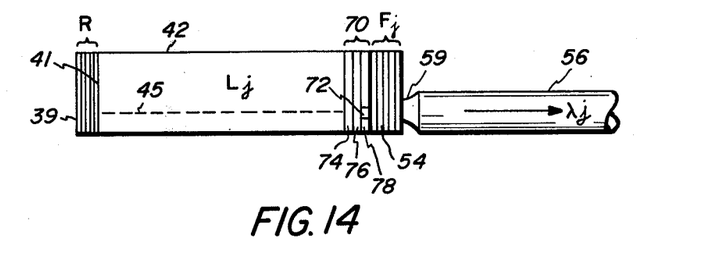
FIG. 14 is similar to the device shown in FIG. 13 and includes a multilayer apertured component deposited between the semiconductor laser and the interference filter.

In FIG. 14, the laser 42 includes an apertured component 70 deposited on facet 43 of laser 42. Filter 54 is then deposited on component 70 followed by coupling of optical filter 56 to filter 54 by means of epoxy 59.

The apertured component 70 comprises a dielectric trilayer disclosed in detail in patent application Ser. No. 064,698 filed Aug. 8, 1979 entitled "Apertured and Unapertured Reflector Structures for Electroluminescent Devices" and assigned to the assignee herein (now U.S. Pat. No. 4,280,107). The layers 74, 67 and 78, may, respectively, comprise $Al_2O_3$, Si and Te. The ablation of layer 78 is accomplished by operation of laser 42 using its optical power to form an aperture 72. The emitted radiation from laser 42 is at the highest intensity at aperture 72 so that the laser will operate with its lowest light loss in the region of aperture and provide stabilization in its operation in the fundamental transverse mode while providing a wavelength $\lambda_j$, of significantly undiverged properties.

The incorporation of the fiber optic device 10 as shown in either of FIGS. 6 or 9 between the filter 54 and the optical fiber 56 in FIG. 14, would provide both fundamental transverse and longitudinal mode control for laser 42 at the selected wavelength, $\lambda_j$.

Each of the reflectors 39 in FIGS. 10, 12, 13 and 14 may readily be replaced by the partial wavelength filter 60 discussed and shown in FIG. 7.

While the invention has been described in conjunction with specific embodiments, it is evident that many alternative modifications and variations will be apparent to those skilled in the art in light of the foregoing description. Accordingly, it is intended to embrace all such alternatives, modifications, and variations as fall within the spirit and scope of the appended claims.

What is claimed is:

1. A solid state laser capable of producing a controlled narrow wavelength of emission and including a radiation generating medium within a first optical cavity, a passive waveguide medium forming a second optical cavity, said cavities being optically coupled together, reflector means at the extremities of said cavities and at the point of their coupling, at least one of said reflector means being a narrow band reflector having a peak reflectivity within the gain spectra of radiation emission from said medium whereby a dual cavity is established selective of a narrow band of operating wavelengths.

2. The laser according to claim 1 wherein there is at least one additional optical cavity optically coupled to said second optical cavity.

3. The laser according to claim 1 wherein said laser produces a periodic optical pulse train, the pulses therein occurring at a time interval determined by the round trip propagation of radiation in said optical cavities.

4. The laser according to claim 3 wherein said time interval between said pulses may be varied by varying the effective length of at least one of said optical cavities.

5. The laser according to claim 1 including means to effectively vary the length of the optical path through said second optical cavity whereby the wavelength of said laser may be selectively adjusted.

6. The laser according to claim 1 wherein said passive waveguide medium comprises a single mode optical fiber.

7. The laser according to claim 1 wherein said passive waveguide medium comprises a multimode optical fiber.

8. The laser according to claim 1 including a micro collimating lens forming said second optical cavity, one of said reflector means being formed directly on said lens.

9. The laser according to claim 1 including a micro collimating lens within said second optical cavity, one of said reflector means being formed directly on said lens.

10. The laser according to claim 1 wherein the reflector means between said optical cavities has an aperture formed through a portion of said reflector means, said aperture being in alignment with said optical cavities whereby said laser will operate with lowest radiation loss in the region of said aperture and whereby stable fundamental transverse mode operation is achieved.

* * * * *